United States Patent [19]
Koshikawa

[11] Patent Number: 5,867,447
[45] Date of Patent: Feb. 2, 1999

[54] SYNCHRONOUS SEMICONDUCTOR MEMORY HAVING A WRITE EXECUTION TIME DEPENDENT UPON A CYCLE TIME

[75] Inventor: Yasuji Koshikawa, Tokyo, Japan

[73] Assignee: NEC Corporation, Tokyo, Japan

[21] Appl. No.: 745,821

[22] Filed: Nov. 12, 1996

[30] Foreign Application Priority Data

Nov. 10, 1995 [JP] Japan .................................. 7-292854

[51] Int. Cl.$^6$ ...................................................... G11C 8/00
[52] U.S. Cl. ...................... 365/233; 365/194; 365/189.05
[58] Field of Search ............................... 365/233, 189.01, 365/194, 238.5, 189.05

[56] References Cited

U.S. PATENT DOCUMENTS

| | | | |
|---|---|---|---|
| 5,293,347 | 3/1994 | Ogawa | 365/230.01 |
| 5,341,341 | 8/1994 | Fukuzo | 365/233 |
| 5,576,996 | 11/1996 | Awaya et al. | 365/189.01 |
| 5,581,512 | 12/1996 | Kitamura | 365/189.01 |
| 5,617,361 | 4/1997 | Sugawara | 365/189.01 |

FOREIGN PATENT DOCUMENTS

| | | |
|---|---|---|
| 704848 | 4/1996 | European Pat. Off. . |
| 61-148692 | 7/1986 | Japan . |
| 2-247893 | 10/1990 | Japan . |
| 4-243085 | 8/1992 | Japan . |
| 5-166376 | 7/1993 | Japan . |
| 6-76566 | 3/1994 | Japan . |
| 8-96573 | 4/1996 | Japan . |

*Primary Examiner*—Tan T. Nguyen

[57] ABSTRACT

In a synchronous semiconductor memory, there is provided a write pulse generating circuit receiving a pipeline enable signal, a write enable signal and an internal synchronous signal which is generated by delaying an output of an internal synchronous signal generating circuit by a first delay. This write pulse generating circuit includes a second delay, and is configured to generate a write pulse which is put into an inactivate condition for a constant time corresponding to a delay time of the second delay when the internal synchronous signal is brought to a high level, and thereafter, is maintained in an activate condition until the next internal synchronous signal is supplied. Thus, by adjusting the delay amount of the first delay and the delay amount of the second delay, a column selection line is never switched during a period that a write data is being supplied to write bus pairs, so that the write data is accurately written into a sense amplifier. Thus, the write execution time depends upon the cycle time, with the result that the cycle time for the writing can be shortened.

7 Claims, 10 Drawing Sheets

SYNCHRONOUS SEMICONDUCTOR MEMORY HAVING A WRITE EXECUTION TIME DEPENDENT UPON A CYCLE TIME

BACKGROUND OF THE INVENTION

1. Field of the Invention

The present invention relates to a semiconductor memory, and more specifically to a write control circuit for use in a synchronous semiconductor memory.

2. Description of Related Art

With a recent speed-up of microprocessors, a demand for elevating an access speed of a semiconductor memory is increasing. However, this demand has not yet been satisfied because of physical limits in micro-fabrication and an increased chip size attributable to an increased memory capacity. One of the approaches for realizing the speed-up of the semiconductor memory is a synchronous semiconductor memory having an internal pipeline structure, some examples of which have been disclosed by Japanese Patent Application Laid-open Publication JP-A-61-148692, JP-A-6-076566 which corresponds to U.S. Pat. No. 5,341,341, and Japanese Patent Application No. 232732/1994 which was laid open as JP-A-8-096573 on Apr. 12, 1996, which corresponds to EP-A-0704848 published on Apr. 3, 1996. The disclosure of these publications is incorporated by reference in their entirety into this application.

This synchronous semiconductor memory having the internal pipeline structure, is featured in that, at the time of reading, an address access path is divided into a plurality of stages, and the reading is carried out in a time-division manner, so that a cycle time is shortened. Therefore, at the time of writing, it is necessary to write data into a sense amplifier during the shortened cycle time.

Referring to FIG. 1, there is shown a block diagram illustrating one example of the prior art synchronous semiconductor memory.

An input section of the shown semiconductor memory includes a plurality of input circuits connected to receive a plurality of bits of an input address ADD. These input circuits are represented by only one input circuit 1 for simplification of drawing. The input section also includes a plurality of input circuits 2 to 5 connected to receive a plurality of control signals RASB, CASB, WEB and CSB, respectively, an input circuit 6 connected to receive an external clock CLK, and an input circuit 7 connected to receive data DQ from a data input/output terminal.

An internal circuit of the shown semiconductor memory includes a synchronous signal generating circuit 8 connected to an output of the input circuit 6 for generating a synchronous signal ICLK1, a delay DL3 receiving the synchronous signal ICLK1 for generating another synchronous signal ICLK1D by delaying the received synchronous signal ICLK1 by a predetermined constant time, a command decoder 9 connected to receive outputs of the input circuits 2 to 5, for generating a read enable signal REN and a write enable signal WEN in synchronism with the synchronous signal ICLK1, and a pipeline enabling circuit 10 receiving the read enable signal REN, the write enable signal WEN and a burst end signal BSTEND explained hereinafter, for generating a pipeline enable signal PEN.

The internal circuit of the shown semiconductor memory also includes a burst counter 11 receiving an output of the input circuit 1, the pipeline enable signal PEN and the synchronous signal ICLK1, for generating a plurality of internal address signals IADD, plate selection signals PSEL1 and the above mentioned burst end signal BSTEND, a column decoder 12A receiving the plurality of internal address signals IADD, and having outputs connected to a plurality of column selection lines YSW, a buffer 19 receiving the plate selection signals PSEL1 for outputting plate selection signals PSEL2, another buffer 20 receiving an output of the input circuit 7 for outputting a write data to a write bus WBUS1, a write pulse generating circuit 13 receiving the pipeline enable signal PEN, the write enable signal WEN and the synchronous signal ICLK1, for generating a write pulse WP, an AND gate AN receiving the plate selection signals PSEL2 and the write pulse WP, for generating a write switch signal WSW, a write buffer 14 receiving the write switch signal WSW and the write bus WBUS1, for supplying a write data to write bus pairs WBUS2T/N, an array of memory cells 15, and sense amplifiers 16 connected to the column selection lines YSW and the write bus pairs WBUS2T/N, and also connected to the memory cell array 15 through digit line pairs DT/N.

The write pulse generating circuit 13 includes a NAND gate NAN3 receiving the pipeline enable signal PEN, the write enable signal WEN and the synchronous signal ICLK1, a delay DL4 receiving an output of the NAND gate NAN3 for generating a signal by delaying the received signal by a predetermined constant time, and a NAND gate NAN4 receiving the output of the NAND gate NAN3 and an output of the delay DL4, for outputting the write pulse WP.

Now, operation of the shown system will be described with reference to FIG. 2, which is a timing chart illustrating an operation of the prior art synchronous semiconductor memory.

If the control signals RASB, CASB, WEB and CSB are set to take respective levels indicative of a write command at a rising of the external clock CLK of a cycle C1, the command decoder 9 brings the write enable signal WEN to a high level in response to the synchronous signal ICLK1 which assumes a high level in response to the external clock CLK. Accordingly, the pipeline enable signal PEN is also brought to the high level by the pipeline enable circuit 10.

If the write command is inputted, the burst counter 11 generates an internal address IADD for a separately set "burst length". Here, the "burst length" means the number of bits of data to be written when one write command is applied, and is set at a time earlier than the cycle C1 in FIG. 2. The shown example illustrate the case that it is set to the "burst length"=2.

Therefore, the internal address IADD for the separately set "burst length" (2 bits) is generated in cycles C1 nd C2 by the burst counter 11, and then, a high level pulse is generated as the burst end signal BSTEND by the burst counter 11 in response to a rising of the synchronous signal ICLK1 of a cycle C3. In response to the burst end signal BSTEND, the pipeline enable circuit 10 brings the pipeline enable signal PEN to a low level.

In synchronism with the synchronous signal ICLK1, the plate selection signal PSEL1 and the internal address IADD (not shown in FIG. 2) are generated and the column decoder 12A receiving the internal address IADD selects one of the column selection lines YSW. In the shown example, the plate selection signals PSEL1 are not changed in the cycle C2, but the selected line of the column selection lines YSW is changed for each cycle. In addition, the content of the plate selection signals PSEL1 are transferred as the plate selection signals PSEL2, and a write data is transferred to the write bus WBUS1.

During the cycle C1, after both the write enable signal WEN and the pipeline enable signal PEN are brought to the high level, if the synchronous signal ICLK1D is generated with the predetermined constant delay time from the synchronous signal ICLK1, the output of the NAND gate NAN3 is brought to a low level (this is not shown in FIG. 2), and therefore, the write pulse WP is brought to a high level. Thereafter, if the synchronous signal ICLK1D is brought to the low level, the output of the delay DL4 is brought to the high level after the predetermined delay time (this is also not shown in FIG. 2), with the result that the write pulse WP is brought to the low level.

During the next cycle C2, the write pulse WP is similarly generated, but during the cycle C3, the write pulse WP is maintained at the low level, because the pipeline enable signal PEN is brought to the low level before the synchronous signal ICLK1D is brought to the high level, and therefore, the output of the NAND gate NAN3 remains at the high level. On the other hand, the write data is transferred to the write bus pairs WBUS2T/N when the write switch signal WSW (which is generated in response to the write pulse WP during a period that the plate selection signal PSEL2 is at the high level) is at the high level.

Here, it is sufficient if the rising timing of the synchronous signal ICLK1D is determined by adjusting the delay amount of the delay DL3 to the effect that the write switch signal WSW is brought to the high level after the column selection lines YSW, the plate selection signals PSEL2 and the write bus WBUS1 are changed, and if the delay amount of the delay DL4 is adjusted to ensure that the write switch signal WSW is brought to the low level after data has been accurately written into the sense amplifier 16.

As seen from the above, the write execution time, namely, the high level width of the write pulse WP is determined by the delay amount of the delay DL4. Assuming that the write execution time is $t_{WP}$ and the cycle time is $t_{CK}$, the low level width $t_{WPB}$ of the write switch signal WSW is expressed as follows:

$$t_{WPB} = t_{CK} - t_{WP} \quad (1)$$

In addition, assuming that a minimum value of the low level width $t_{WPB}$ of the write pulse WP and the write switch signal WSW, required for changing the column selection lines YSW, the plate selection signals PSEL2 and the write bus WBUS1, is $t_{WPBmin}$, the cycle time $t_{CK}$ is expressed as follows:

$$t_{CK} > t_{WP} + t_{WPBmin} \quad (2)$$

Referring to FIG. 3, there is shown a timing chart illustrating an operation of the prior art synchronous semiconductor memory in the case that the cycle time $t_{CK}$ is long. As seen from comparison between FIGS. 2 and 3, even if the cycle time $t_{CK}$ is long, the write execution time $t_{WP}$ is the same as that of the example shown in FIG. 2. Namely, the write execution time $t_{WP}$ is constant independently of the cycle time $t_{CK}$.

The required write execution time $t_{WP}$ is different from one semiconductor memory to another, because of a manufacturing process variation. Accordingly, it is necessary to determine the delay amount of the delay DL4 and to set the write execution time $t_{WP}$, with a margin which makes it possible to perform an accurate writing in most of devices.

In other words, the write execution time $t_{WP}$ is set to meet with devices manufactured under the process condition which needs the longest write execution time, by taking the manufacturing process variation into consideration. As a result, in devices manufactured under a standard process condition, the write execution time $t_{WP}$ becomes longer than a required time, which results in an unnecessarily long cycle time $t_{CK}$. Namely, all of devices have the same long cycle time $t_{CK}$ as that of the devices manufactured under the process condition which needs the longest write execution time.

At present, the cycle time for the reading is being speeded up, and therefore, the speed grade is often determined by the cycle time for the writing. In the above mentioned situation, only devices having a low speed grade can be manufactured.

If the write execution time $t_{WP}$ is set to meet with the devices manufactured under the standard process condition, the number of devices which cannot accurately write and therefore become defective, increases.

Under the above mentioned circumstance, in order to shorten the cycle time for the writing, Japanese Patent Application Laid-open Publication JP-A-4-243085, which corresponds to U.S. Pat. No. 5,293,347, proposes to provide two write buffers or drivers for one sense amplifier. The disclosure of these publications is incorporated by reference in their entirety into this application.

However, in this approach, the write execution time required for one writing cannot be shortened, and therefore, it was still necessary to set the write execution time $t_{WP}$ so as to meet with devices manufactured under the process condition which needs the longest write execution time.

SUMMARY OF THE INVENTION

Accordingly, it is an object of the present invention to provide a synchronous semiconductor memory which has overcome the above mentioned defect of the conventional ones.

Another object of the present invention is to provide a synchronous semiconductor memory capable of shortening the cycle time for the writing.

The above and other objects of the present invention are achieved in accordance with the present invention by a semiconductor memory comprising a plurality of memory cells, a plurality of sense amplifiers connected through digit lines to the memory cells, and a write control means receiving a synchronous signal generated on the basis of an external clock, for generating a write switch signal for controlling a writing of data to the sense amplifiers, the write control means maintaining the write switch signal in an inactive condition until a first timing after at least a first predetermined delay time from the synchronous signal, and bringing the write switch signal into an active condition at a second timing after a second predetermined delay time from the first timing, the write control means maintaining the write switch signal in the active condition until a synchronous signal next to the synchronous signal is generated.

In one embodiment, the write control means includes a pulse generating circuit receiving the internal synchronous signal for generating a pulse starting from the first timing and having a pulse width corresponding to a difference between the first timing and the second timing, and a logic gate means receiving a plate selection signal and the pulse, for generating the write switch signal which is maintained in the inactive condition until the first timing firstly appearing after the logic gate means receives the plate selection signal.

Preferably, the semiconductor memory further includes means for switching a plurality of column selection lines connected to the sense amplifiers, after the first timing but before the second timing.

More preferably, the semiconductor memory further includes a synchronous signal generating circuit receiving the external clock for generating a first internal synchronous signal in synchronism with the external clock, and a delay means receiving the first internal synchronous signal for generating a second internal synchronous signal by delaying the first internal synchronous signal. The write control means brings the write switch signal into the inactive condition in synchronism with the second internal synchronous signal, and the column selection signal is switched in synchronism with the second internal synchronous signal.

In a preferred embodiment, the semiconductor memory further includes a write buffer receiving the write switch signal and a first write bus for transferring a write data, and connected through a second write bus to the plurality of sense amplifiers, and a latch means connected to receive the write data from an external and having an output connected to the first write bus, the latch means updating the write data on the first write bus in synchronism with the second internal synchronous signal.

Alternatively, there is provided another latch means receiving the plate selection signal for outputting the plate selection signal latched in the latch means, the latch means updating the latched plate selection signal in synchronism with the second internal synchronous signal.

Furthermore, the semiconductor memory further includes a command decoder receiving a plurality of control signals from an external, for generating a write enable signal, a pipeline enabling circuit receiving at least the write enable signal, for generating a pipeline enable signal, a write mask control means receiving a data mask command from the external, for generating a write mask control signal, and a write pulse generating circuit receiving the write enable signal, the pipeline enable signal, the write mask control signal, and the synchronous signal, for maintaining the write switch signal in the inactive condition when at least one of the write enable signal and the pipeline enable signal is inactive, or when the write mask control signal is active.

The above and other objects, features and advantages of the present invention will be apparent from the following description of preferred embodiments of the invention with reference to the accompanying drawings.

DESCRIPTION OF THE PREFERRED EMBODIMENTS

Figure 4:
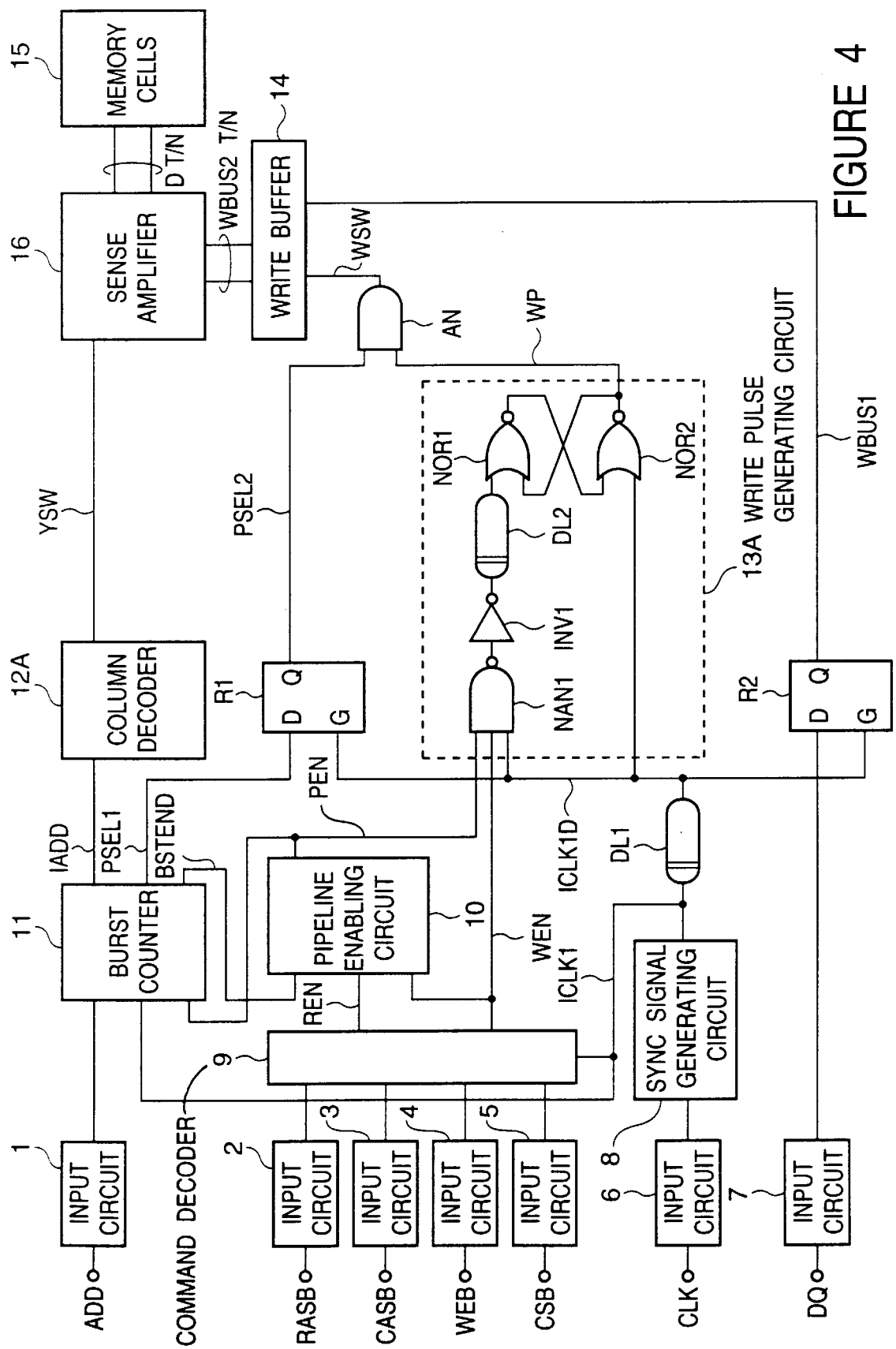
FIG. 4 is a block diagram of a first embodiment of the synchronous semiconductor memory in accordance with the present invention.

Referring to FIG. 4, there is shown a block diagram of a first embodiment of the synchronous semiconductor memory in accordance with the present invention. In FIG. 4, elements corresponding to those shown in FIG. 1 are given the same Reference Numerals.

Figure 1:
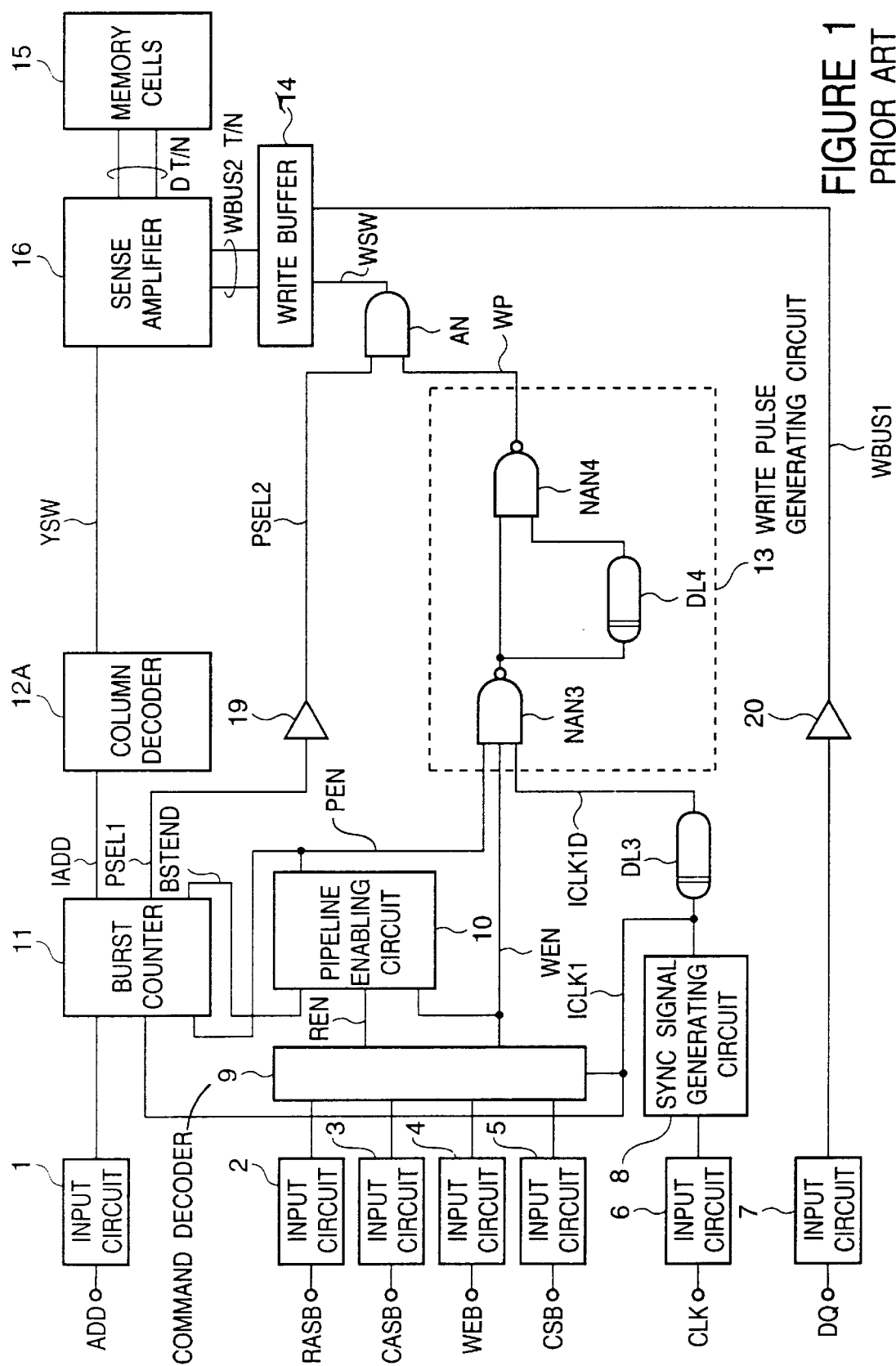
FIG. 1 is a block diagram illustrating one example of the prior art synchronous semiconductor memory.
Figure 2:
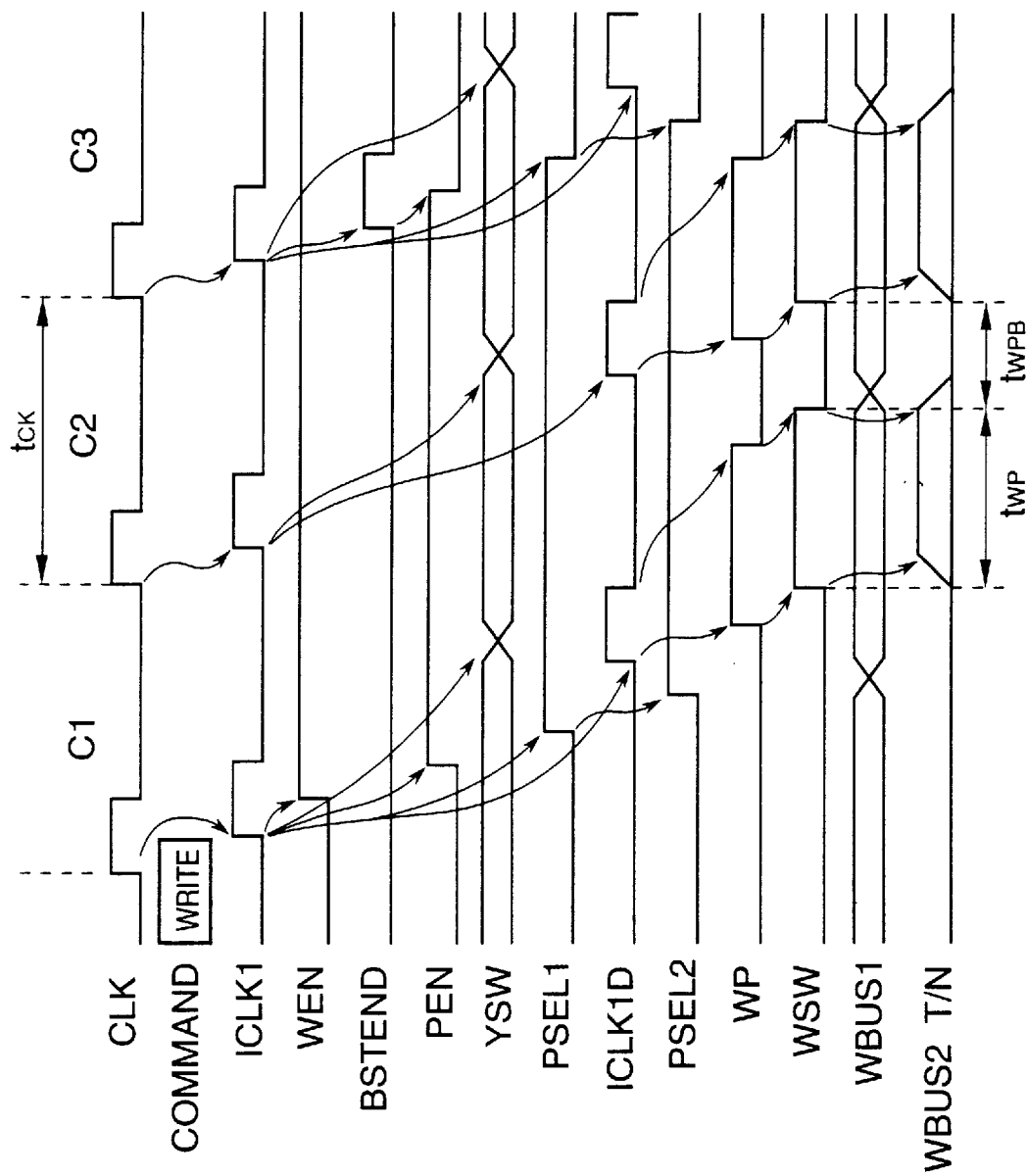
FIG. 2 is a timing chart illustrating an operation of the prior art synchronous semiconductor memory shown in FIG. 1.
Figure 3:
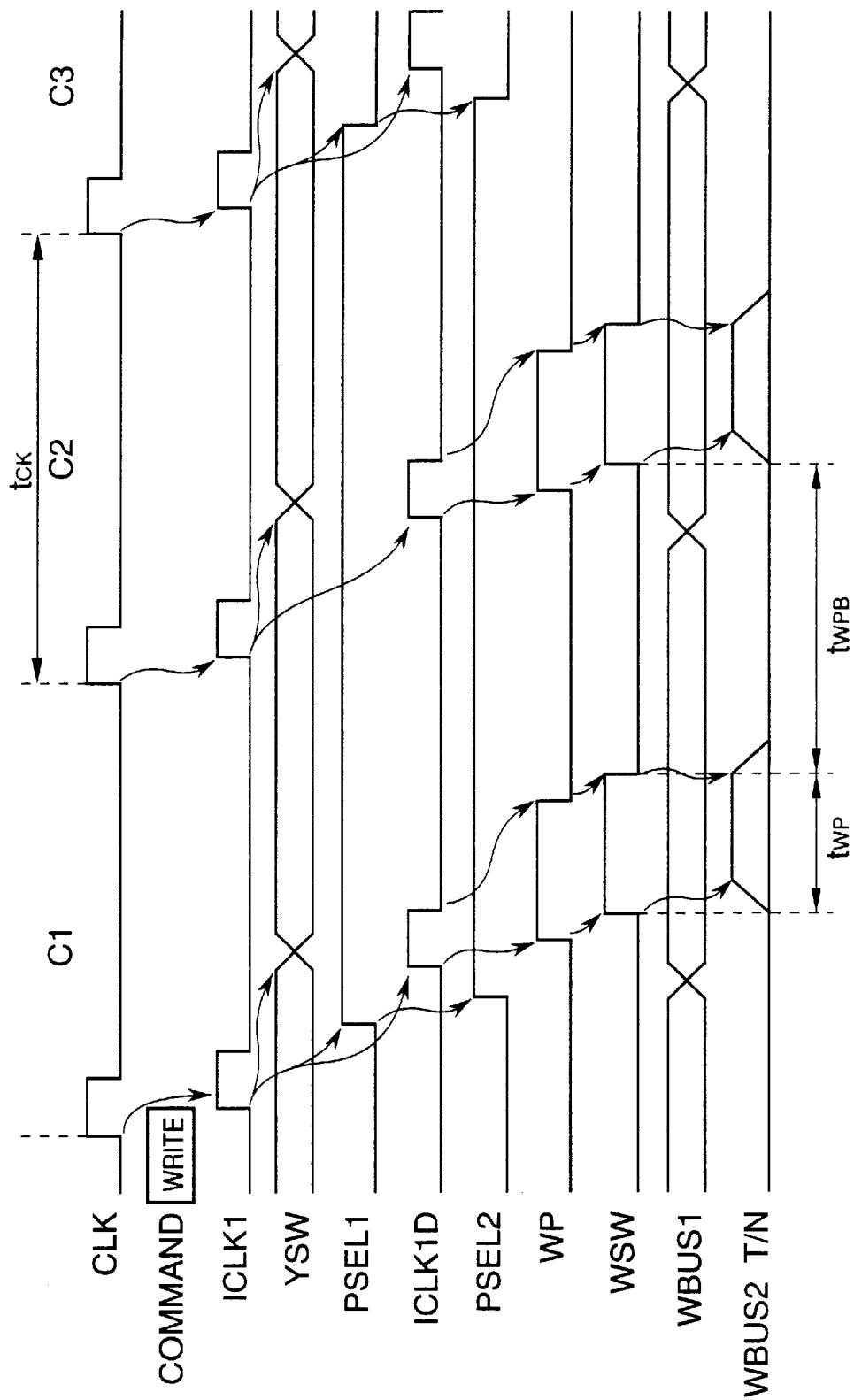
FIG. 3 is a timing chart illustrating an operation of the prior art synchronous semiconductor memory shown in FIG. 1, in the case that the cycle time is long.

Similarly to the prior art example shown in FIG. 1, an input section of the shown first embodiment of the synchronous semiconductor memory in accordance with the present invention includes a plurality of input circuits connected to receive a plurality of bits of an input address ADD. These input circuits are represented by only one input circuit 1 for simplification of drawing. The input section also includes a plurality of input circuits 2 to 5 connected to receive a plurality of control signals RASB, CASB, WEB and CSB, respectively, an input circuit 6 connected to receive an external clock CLK, and an input circuit 7 connected to receive data DQ from a data input/output terminal.

An internal circuit of the shown embodiment includes a synchronous signal generating circuit 8 connected to an output of the input circuit 6 for generating an internal synchronous signal ICLK1, a delay DL1 receiving the internal synchronous signal ICLK1 for generating another internal synchronous signal ICLK1D by delaying the received synchronous signal ICLK1 by a predetermined constant time, a command decoder 9 connected to receive outputs of the input circuits 2 to 5, for generating a read enable signal REN and a write enable signal WEN in synchronism with the internal synchronous signal ICLK1, and a pipeline enabling circuit 10 receiving the read enable signal REN, the write enable signal WEN and a burst end signal BSTEND explained hereinafter, for generating a pipeline enable signal PEN.

The internal circuit of the shown embodiment also includes a burst counter 11 receiving an output of the input circuit 1, the pipeline enable signal PEN and the internal synchronous signal ICLK1, for generating a plurality of internal address signals IADD, a plurality of plate selection signals PSEL1 and the above mentioned burst end signal BSTEND (the internal address signals IADD and the plate selection signals PSEL1 are represented by only one line for simplification of drawing), a column decoder 12A receiving the plurality of internal address signals IADD, and having outputs connected to a plurality of column selection lines YSW (which are represented by only one line for simplification of drawing), a plurality of D-latches (which are represented by only one D-latch R1 for simplification of drawing) each receiving a corresponding one of the plate selection signals PSEL1 for outputting a plate selection signals PSEL2 in synchronism with the internal synchronous signal ICLK1D.

Furthermore, the internal circuit of the shown embodiment includes a plurality of D-latches (which are also represented by only one D-latch R2 for simplification of drawing) each receiving a corresponding one of outputs of the input circuit 7 for outputting a write data to a write bus WBUS1 in synchronism with the internal synchronous signal ICLK1D, a write pulse generating circuit 13A receiving the pipeline enable signal PEN, the write enable signal WEN and the internal synchronous signal ICLK1D, for generating a write pulse WP, a plurality of AND gate (which are also represented by only one AND gate AN for simplification of drawing) each receiving a corresponding plate selection signal PSEL2 and the write pulse WP, for generating a write switch signal WSW, a write buffer 14 receiving the write switch signals WSW and the write bus WBUS1, for supplying a write data to write bus pairs WBUS2T/N, a memory array composed of a number of memory cells 15, and sense amplifiers 16 connected to the column selection lines YSW and the write bus pairs WBUS2T/N, and also connected to the memory cell array 15 through digit line pairs DT/N.

The write pulse generating circuit 13A includes a NAND gate NAN1 receiving the pipeline enable signal PEN, the write enable signal WEN and the synchronous signal ICLK1D, an inverter INV1 receiving an output of the NAND gate NAN1, a delay DL2 receiving an output of the inverter INV1, and a flipflop composed of a NOR gate NOR1 receiving an output of the delay DL2 and another NOR gate NOR2 receiving the internal synchronous signal ICLK1D and outputting the write pulse WP.

Now, operation of the shown system will be described with reference to FIG. 5, which is a timing chart illustrating an operation of the shown first embodiment.

If the control signals RASB, CASB, WEB and CSB are set to take respective levels indicative of a write command at the timing of a rising of the external clock CLK of a cycle C1, the command decoder 9 brings the write enable signal WEN to a high level in response to the internal synchronous signal ICLK1 which assumes a high level in response to the external clock CLK. Accordingly, the pipeline enable signal PEN is also brought to the high level by the pipeline enable circuit 10.

If the pipeline enable signal PEN is brought to the high level, the burst counter 11 generates a column address, a portion of which is supplied, as the internal address IADD, to the column decoder 12A for column selection. Another portion of the generated column address is used for a plate selection as the plate selections signals (PSEL1, PSEL2).

Here, a relation between the plate selection signals (PSEL1, PSEL2) and the internal address IADD for the sense amplifiers associated to the memory cells, will be explained. All of the sense amplifiers are divided into a plurality of sense amplifier groups, each of which is constituted of a predetermined constant number of sense amplifiers. The plate selections signals (PSEL1, PSEL2) are used for selecting one sense amplifier group among the plurality of sense amplifier groups. On the other hand, the internal address IADD is used for selecting one sense amplifier among the plurality of sense amplifier groups included in the selected sense amplifier group.

In a first cycle after the pipeline enable signal PEN is brought to the high level, the burst counter 11 outputs the internal address IADD (not shown in FIG. 5) corresponding to the supplied external address ADD, but in second and succeeding cycles, the burst counter 11 automatically updates the internal address IADD, so that the internal address IADD updated in the burst counter 11 is continuously outputted. In other words, the internal address IADD corresponding to the external address ADD supplied in a write command input cycle is incremented from its LSB bit for each cycle in the burst counter 11, so that the internal addresses corresponding to the burst length are sequentially automatically outputted. After the internal addresses corresponding to the burst length have been outputted, the burst end signal BSTEND is brought to the high level.

Figure 5:
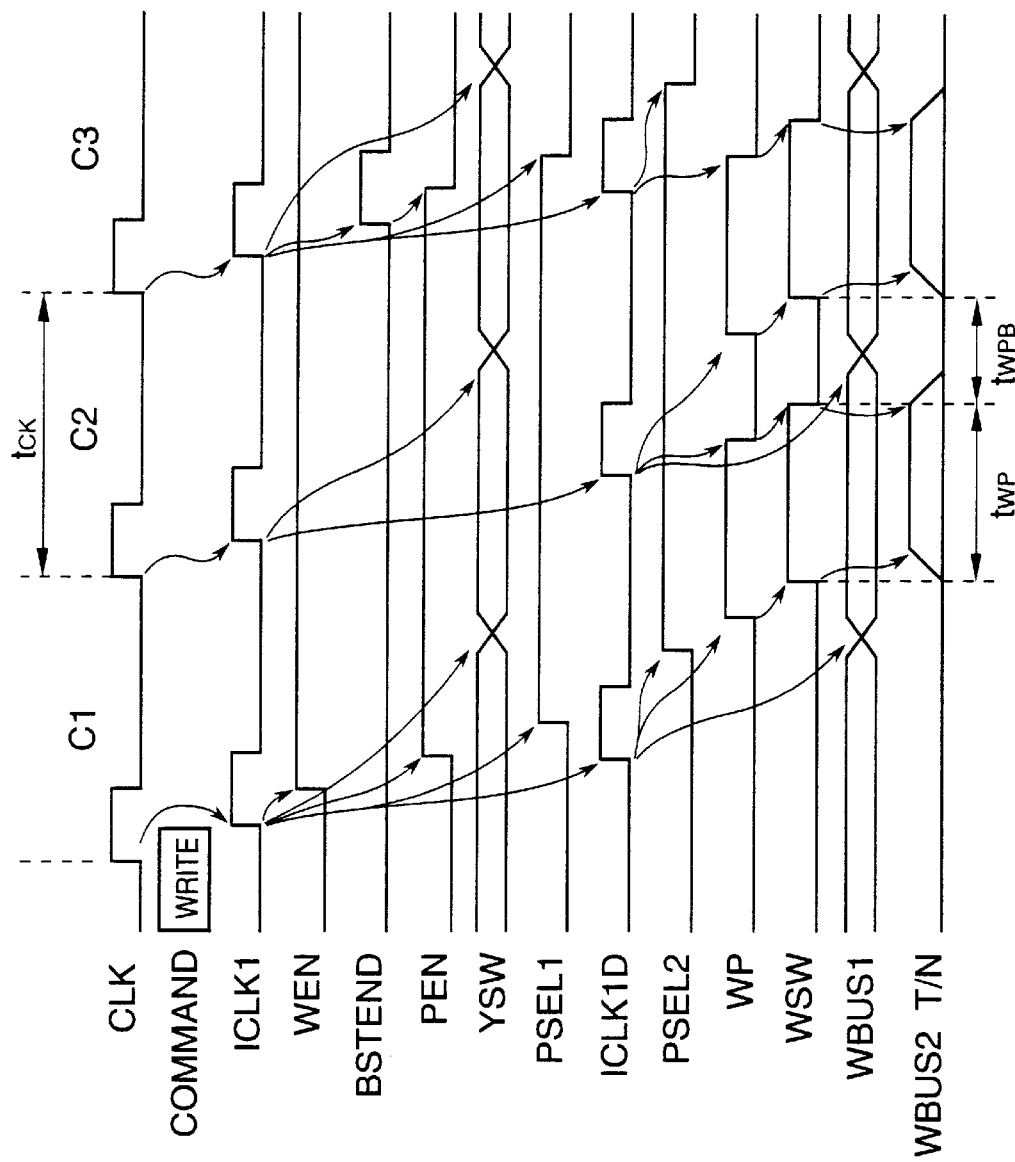
FIG. 5 is a timing chart illustrating an operation of the synchronous semiconductor memory shown in FIG. 4.

In the example shown in FIG. 5, the "burst length" is 2 bits. Therefore, the internal addresses corresponding to the burst length of 2 bits are generated in the cycles C1 and C2, and thereafter, the burst end signal BSTEND is brought to the high level in synchronism with the rising of the internal synchronous signal ICLK1 of the cycle C3. As a result, the pipeline enable signal PEN is brought to the low level.

The plate selection lines PSEL1 and the internal address IADD (not shown in FIG. 5) are activated or generated in synchronism with the internal synchronous signal ICLK1, and the column decoder 12A receiving the internal address IADD selects one of the column selection lines YSW. In the shown embodiment, the selected plate selection signals PSEL1 are not changed in the cycle C2, but the selected line of the column selection lines YSW is changed for each cycle.

The internal synchronous signal ICLK1D is generated with a predetermined delay from the internal synchronous signal ICLK1, and the content of the plate selection lines PSEL1 are latched in the D-latch circuits R1 in synchronism with the rising of the internal synchronous signal ICLK1D, and therefore, the content of an active plate selection signal PSEL1 is latched in the D-latch circuit R1 corresponding to a plate to be selected, so that the active plate selection signal PSEL1 is transferred as the plate selection signal PSEL2, and on the other hand, a write data is transferred to the write bus WBUS1 by action of the D-latch circuit R2 in synchronism with the rising of the internal synchronous signal ICLK1D.

During the cycle C1, after both the write enable signal WEN and the pipeline enable signal PEN are brought to the high level, if the internal synchronous signal ICLK1D is brought to the high level, the output of the NAND gate NAN1 is brought to a low level (this is not shown in FIG. 5), and therefore, the write pulse WP is brought to a high level after a predetermined constant delay time of the delay DL2. Thereafter, during the next cycle C2, the synchronous signal ICLK1D is brought to the high level, the flipflop composed of the NOR gates NOR1 and NOR2 is reset, so that the write pulse WP is brought to the low level at once. However, since the output of the NAND gate NAN1 is brought to the low level again (not shown in FIG. 5), the write pulse WP is brought to a high level again after the predetermined constant delay time.

During the next cycle C3, when the synchronous signal ICLK1D is brought to the high level, the flipflop is reset, so that the write pulse WP is brought to the low level. At this time, however, since the pipeline enable signal PEN becomes the low level, the output of the NAND gate NAN1 is maintained at the high level, so that the write pulse WP remains at the low level. On the other hand, the write data is outputted to the write bus WBUS1 through the D-latch circuit R2 in synchronism with the synchronous signal ICLK1D. In addition, during a period that the plate selection signal PSEL2 is at the high level, the write switch signal WSW is generated in accordance with to the write pulse WP by the AND gate AN corresponding to the plate to be selected. When the write switch signal WSW is at the high level, the write data on the write bus WBUS1 is transferred to the write bus pairs WBUS2T/N.

Here, if the rising timing of the internal synchronous signal ICLK1D is determined by adjusting the delay amount of the delay DL1 to the effect that the switching of the column selection lines YSW and the switching of the plate selection lines PSEL2 and the updating of the write bus WBUS1 occur substantially concurrently, and the write switch signal WSW is brought to the low level earlier than the switching of the column selection lines YSW, and if the delay amount of the delay DL2 is adjusted to ensure that the write pulse WP is brought to the high level after the switching of the plate selection lines PSEL2, and the write switch signal WSW is brought to the high level after the switching of the column selection lines YSW and the updating of the write bus WBUS1, the column selection lines YSW are in no way switched during a period that the write data is being outputted on the write bus pairs WNUS2T/N, so that the write data can be accurately written into the sense amplifiers.

As seen from the above, the low level width of the write pulse WP is independent of the cycle time. Here, assuming that the low level width of the write pulse WP is $t_{WPB}$ and the cycle time is $t_{CK}$, the write execution time, namely, the high level width $t_{WP}$ of the write pulse WP is expressed as follows:

$$t_{WP} = t_{CK} - t_{WPB} \qquad (3)$$

Namely, the write execution time $t_{WP}$ depends upon the cycle time $t_{CK}$.

Figure 6:
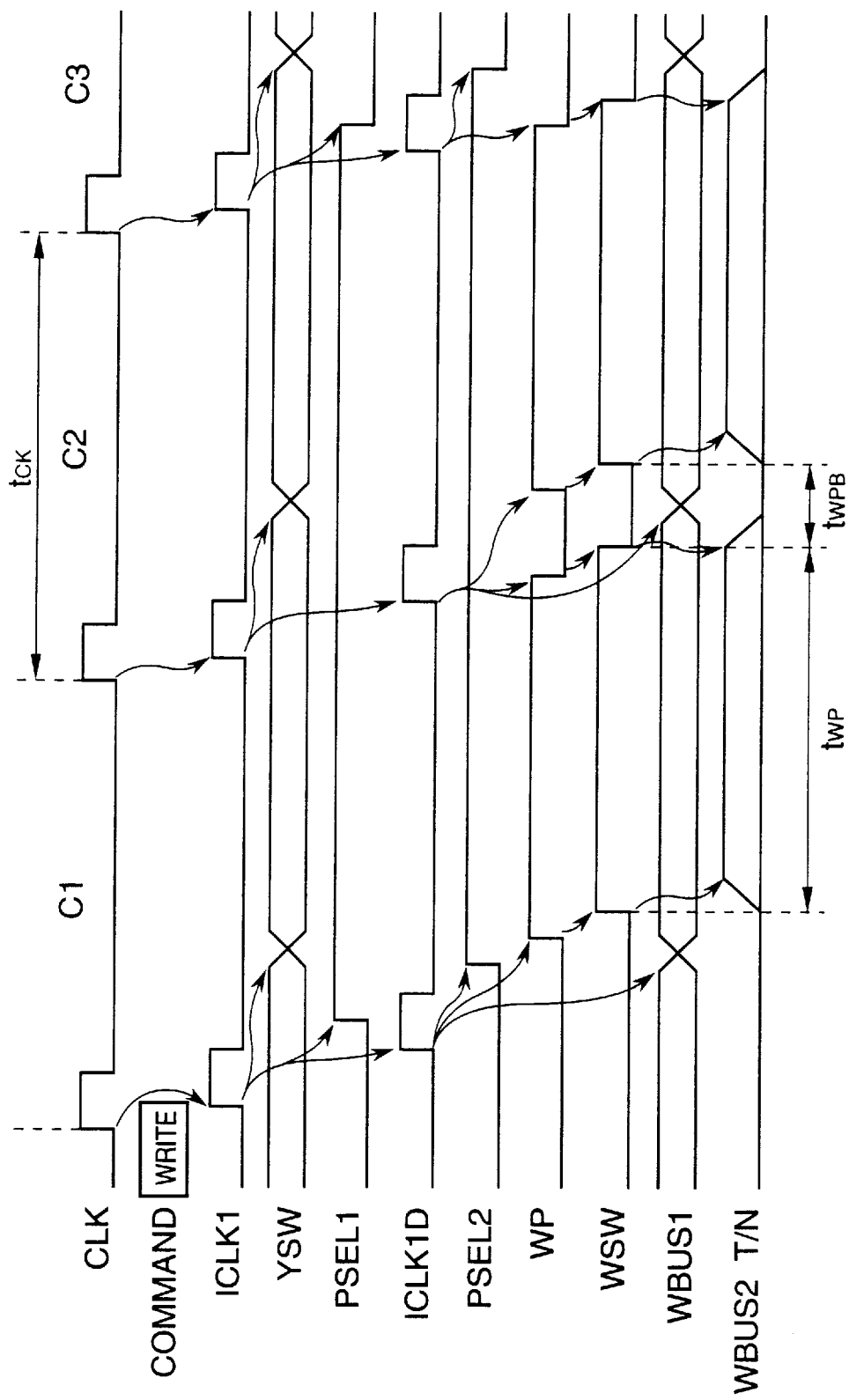
FIG. 6 is a timing chart illustrating an operation of the synchronous semiconductor memory shown in FIG. 4, in the case that the cycle time is long.

Referring to FIG. 6, there is shown a timing chart illustrating an operation of the shown embodiment in the case that the cycle time $t_{CK}$ is long. As seen from comparison between FIGS. 5 and 6, if the cycle time $t_{CK}$ is long, the write execution time $t_{WP}$ correspondingly becomes long.

The pulse generating circuit configured to generate the write pulse WP having the constant low level time width, is used as the means for causing the write execution time $t_{WP}$ to depend upon the cycle time $t_{CK}$ in the present invention. In the embodiment shown in FIG. 4, there is used the write pulse generating circuit 13A configured to generate a pulse having a constant time width by action of the flipflop and the delay DL2. However, it would be apparent to persons skilled in the art that, in principle, it is possible to use another pulse generating circuit, such as various types of monostable circuit, capable of generating a pulse having a constant time width. In this case, it is a matter of course that it is necessary to process the waveform of the write switch signal on the basis of the plate selection signal. In the present invention, however, the monostable type pulse generating circuit is not necessarily indispensable. An indispensable matter is that, in synchronism with the clock, there is generated a signal which is maintained in an active condition from a predetermined (second) timing within each cycle of the clock pulse to a (first) timing which is within a next clock and which is earlier than the second timing of the same next clock by a predetermined time length.

Figure 7:
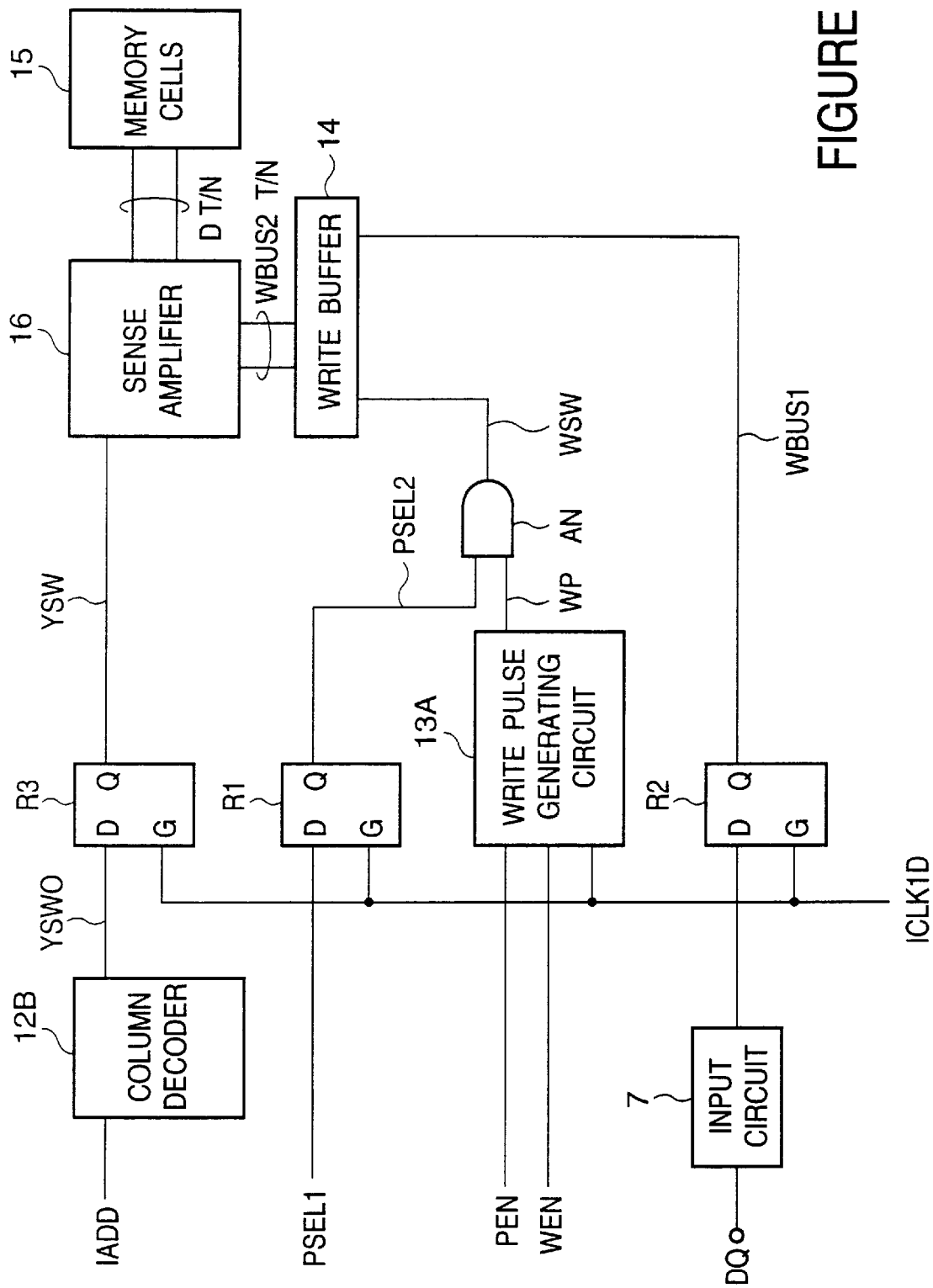
FIG. 7 is a block diagram of an essential part of a second embodiment of the synchronous semiconductor memory in accordance with the present invention.

Referring to FIG. 7, there is a block diagram of an essential part of a second embodiment of the synchronous semiconductor memory in accordance with the present invention. In FIG. 7, elements corresponding to those shown in FIG. 4 are given the same Reference Numerals, and explanation thereof will be omitted for simplification of description.

As seen from comparison between FIGS. 4 and 7, the second embodiment includes, in place of the column decoder 12A shown in FIG. 4, a column decoder 12B receiving a plurality of bits of the internal address IADD for generating a plurality of column selection signals YSW0, and a plurality of latches (which are also represented by only one D-latch R3 for simplification of drawing) each receiving a corresponding one of plurality of column selection signals YSW0, for activating a corresponding column selection line YSW in synchronism with the internal synchronous signal ICLK1D.

Figure 8:
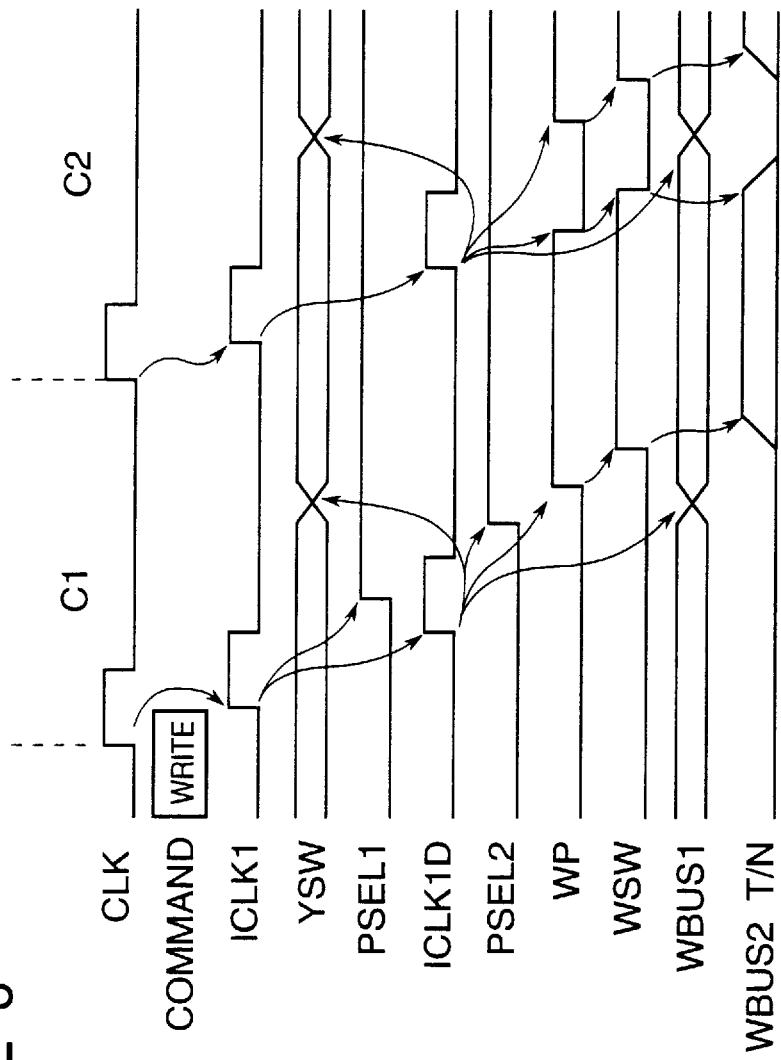
FIG. 8 is a timing chart illustrating an operation of the synchronous semiconductor memory shown in FIG. 7.

Now, operation of the second embodiment will be described with reference to FIG. 8, which is a timing chart illustrating an operation of the synchronous semiconductor memory shown in FIG. 7. However, as seen from comparison between FIGS. 5 and 8, a major part of the operation of the second embodiment is the same as that of the first embodiment, and therefore, only a featured portion of the operation of the second embodiment will be described.

In the second embodiment, the column selection lines YSW are switched in synchronism with the internal synchronous signal ICLK1D. Therefore, it becomes easier to cause the column selection lines YSW, the plate selection lines PSEL2 and the write bus WBUS1 to be switched substantially at the same time. In addition, it also becomes easier to control the timing of the write pulse WP and the write switch signal WSW.

Figure 9:
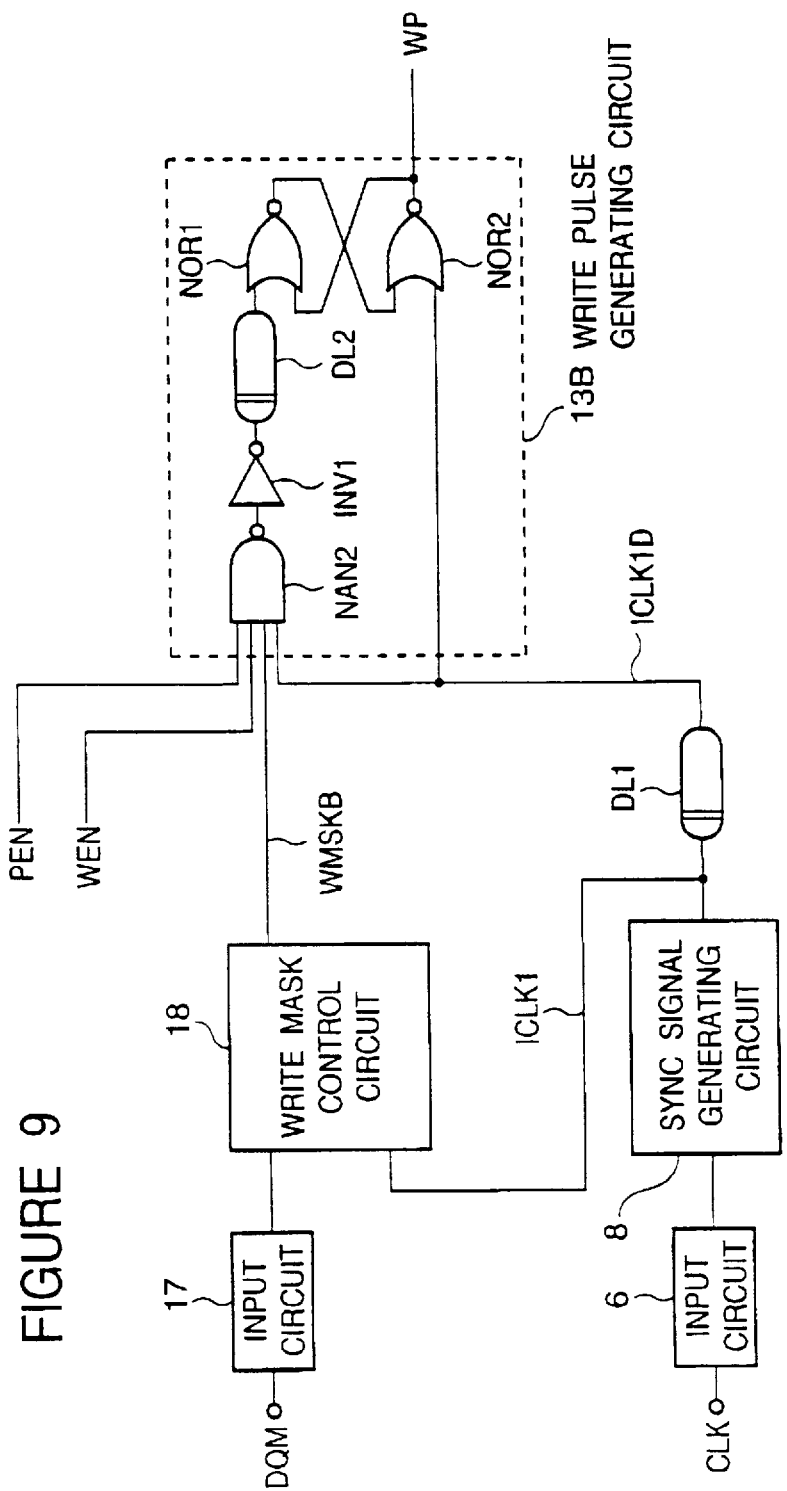
FIG. 9 is a block diagram of an essential part of a third embodiment of the synchronous semiconductor memory in accordance with the present invention.

Referring to FIG. 9, there is shown a block diagram of an essential part of a third embodiment of the synchronous semiconductor memory in accordance with the present invention. In FIG. 9, elements corresponding to those shown in FIGS. 4 and 7 are given the same Reference Numerals, and explanation thereof will be omitted for simplification of description.

In the first and second embodiment shown in FIGS. 4 and 7, if the write command is supplied, the internal address is generated on the basis of only the burst length in order to conduct the writing operation. The third embodiment shown in FIG. 9 is configured to be able to inhibit the writing by supplying a write mask command from an external when data of some bits at some address should not be re-written or replaced with another data.

As seen from comparison between FIG. 9 and FIGS. 4 and 7, the third embodiment additionally includes an input circuit 17 receiving a data mask signal DQM, and a write mask control circuit 18 receiving an output of the input circuit 17, for outputting a write mask control signal WMSKB in synchronism with the internal synchronous signal ICLK1. Furthermore, the third embodiment includes a write pulse generating circuit 13B, in place of the write pulse generating circuit 13A shown in FIG. 4.

This write pulse generating circuit 13B includes a NAND gate NAN2 receiving the pipeline enable signal PEN, the write enable signal WEN, the write mask control signal WMSKB and the internal synchronous signal ICLK1D, an inverter INV1 receiving an output of the NAND gate NAN2, a delay DL2 receiving an output of the inverter INV1, and a flipflop composed of a NOR gate NOR1 receiving an output of the delay DL2 and another NOR gate NOR2 receiving the internal synchronous signal ICLK1D and outputting the write pulse WP.

Figure 10:
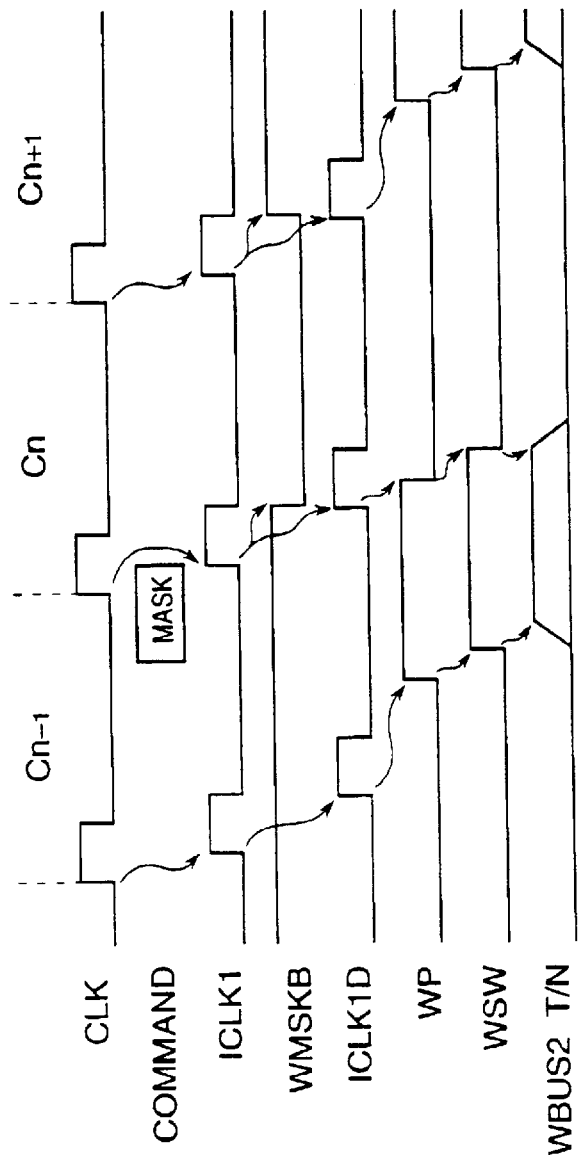
FIG. 10 is a timing chart illustrating an operation of the synchronous semiconductor memory shown in FIG. 9.

Now, operation of the third embodiment will be described with reference to FIG. 10, which is a timing chart illustrating an operation of the synchronous semiconductor memory shown in FIG. 9. However, since some part of the operation of the third embodiment is the same as that of the first embodiment, only a featured portion of the operation of the third embodiment will be described.

If the data mask signal DQM is activated to a level indicative of a mask command at a rising of a cycle Cn of the external clock CLK during a burst period of the writing operation, the write mask control circuit 18 brings the write mask control signal WMSKB to a low (active) level in response to the internal synchronous signal ICLK1 which assumes the high level in response to the external clock CLK. Therefore, even if the internal synchronous signal ICLK1D is brought to the high level in the cycle Cn, the output of the NAND gate NAN2 is maintained at the high level.

Accordingly, after the write pulse is brought to the low level at once in response to the rising of the internal synchronous signal ICLK1D, the write pulse is maintained at the low level during the cycle Cn, so that the writing is not conducted in this cycle Cn. Namely, the writing is masked in this cycle Cn.

If the mask command is not inputted in a next cycle Cn+1, the write mask control signal WMSKB is brought to a high (inactive) level in response to the internal synchronous signal ICLK1. Therefore, when the internal synchronous signal ICLK1D is brought to the high level, the output of the NAND gate NAN2 is brought to the low (not shown in FIG. 10), and the write pulse WP is brought to the high level after the predetermined delay time.

Thus, it is possible to easily control the timing of the write pulse WP and the write switch signal WSW when the write mask control is conducted.

As seen from the above, since the data writing of one cycle is inhibited in response to one write mask input, it is possible to restart the writing from a next cycle. On the other hand, the pipeline enable signals PSEL1 and PSEL2 are maintained in the active condition during the writing inhibiting cycle.

As seen from the above, the synchronous semiconductor memory in accordance with the present invention is characterized in that the write execution time can be elongated dependently upon the cycle time $t_{CK}$. Therefore, although the required write execution time $t_{WP}$ is different from one semiconductor memory to another because of a manufacturing process variation, the write execution time can be made to a minimum write execution time required when each memory device is operated with a minimum cycle time.

In a memory device which can be sufficiently written with a short write execution time, the cycle time $t_{CK}$ can be shortened. On the other hand, a memory device requiring a long write execution time, will never become a defective product, by lowering the speed grade and operating the memory device with a long cycle time $t_{CK}$.

Here, assuming that $\Delta t_{WP}$ is a difference in the required write execution time between a memory device manufactured under the process condition which needs the longest minimum write execution time and a memory device manufactured under the process condition which needs the shortest minimum write execution time, the cycle time $t_{CK(NEW)}$ in the present invention can be shortened in comparison with the cycle time $t_{CK(OLD)}$ in the prior art, as shown in the following equation at maximum:

$$t_{CK(NEW)} = t_{CK(OLD)} - \Delta t_{WP} \tag{4}$$

In the prior art, one of important subjects in a designing step was to set the delay amount of the delays which determines the write execution time $t_{WP}$. In addition, a large number of designing steps were required, since, for example, modification of a diffusion mask was conducted for optimization after commercialization. However, in the memory in accordance with the present invention, since the write execution time $t_{WP}$ is variable in accordance with the cycle time $t_{CK}$, the optimization is easy and the number of designing steps can be greatly reduced.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising a plurality of memory cells, a plurality of sense amplifiers connected through digit lines to said memory cells, and a write control means receiving a synchronous signal generated on the basis of an external clock, for generating a write switch signal for controlling a writing of data to said sense amplifiers, said write control means maintaining said write switch signal in an inactive condition until a first timing after at least a first predetermined delay time from said synchronous signal, and bringing said write switch signal into an active condition at a second timing after a second predetermined delay time from said first timing, said write control means maintaining said write switch signal in said active condition until receipt of the next synchronous signal.

2. A semiconductor memory claimed in claim 1 wherein said write control means includes a pulse generating circuit receiving said synchronous signal for generating a pulse starting from said first timing and having a pulse width corresponding to a difference between said first timing and said second timing, and a logic gate means receiving a plate selection signal and said pulse, for generating said write switch signal which is maintained in said inactive condition until said second timing firstly appearing after said logic gate means receives said plate selection signal.

3. A semiconductor memory claimed in claim 2 further including means for switching a plurality of column selection lines connected to said sense amplifiers, after said first timing but before said second timing.

4. A semiconductor memory claimed in claim 3 further including a synchronous signal generating circuit receiving said external clock for generating a first internal synchronous signal in synchronism with said external clock, and a delay means receiving said first internal synchronous signal for generating a second internal synchronous signal by delaying said first internal synchronous signal, and wherein said write control means brings said write switch signal into said inactive condition in synchronism with said second internal synchronous signal, and said column selection signal is switched in synchronism with said second internal synchronous signal.

5. A semiconductor memory claimed in claim 4, further including a write buffer receiving said write switch signal and a first write bus for transferring a write data, and connected through a second write bus to said plurality of sense amplifiers, and a latch means connected to receive said write data from an external and having an output connected to said first write bus, said latch means updating said write data on said first write bus in synchronism with said second internal synchronous signal.

6. A semiconductor memory claimed in claim 4, further including a write buffer receiving said write switch signal and a first write bus for transferring a write data, and connected through a second write bus to said plurality of sense amplifiers, and a latch means receiving said plate selection signal for outputting said plate selection signal latched in said latch means, said latch means updating said latched plate selection signal in synchronism with said second internal synchronous signal.

7. A semiconductor memory claimed in claim 1, further including a command decoder receiving a plurality of control signals from an external, for generating a write enable signal, a pipeline enabling circuit receiving at least said write enable signal, for generating a pipeline enable signal, a write mask control means receiving a data mask command from the external, for generating a write mask control signal, and a write pulse generating circuit receiving said write enable signal, said pipeline enable signal, said write mask control signal, and said synchronous signal, for maintaining said write switch signal in said inactive condition when at least one of said write enable signal and said pipeline enable signal is inactive, or when said write mask control signal is active.

* * * * *